US009303329B2

(12) United States Patent
Keigler et al.

(10) Patent No.: US 9,303,329 B2
(45) Date of Patent: Apr. 5, 2016

(54) ELECTROCHEMICAL DEPOSITION APPARATUS WITH REMOTE CATHOLYTE FLUID MANAGEMENT

(71) Applicant: TEL NEXX, Inc., Billerica, MA (US)

(72) Inventors: Arthur Keigler, Wellesley, MA (US); David Guarnaccia, Carlisle, MA (US); Demetrius Papapanayiotou, Westford, MA (US); Jonathan Hander, Westford, MA (US)

(73) Assignee: TEL NEXX, INC., Billerica, MA (US)

( * ) Notice: Subject to any disclaimer, the term of this patent is extended or adjusted under 35 U.S.C. 154(b) by 106 days.

(21) Appl. No.: 14/076,610

(22) Filed: Nov. 11, 2013

(65) Prior Publication Data

US 2015/0129418 A1    May 14, 2015

(51) Int. Cl.
| | |
|---|---|
| C25D 21/10 | (2006.01) |
| C25D 17/00 | (2006.01) |
| C25D 7/12 | (2006.01) |
| C25D 17/06 | (2006.01) |
| C25D 17/10 | (2006.01) |
| C25D 21/14 | (2006.01) |
| H01L 21/288 | (2006.01) |

(52) U.S. Cl.
CPC ............. *C25D 21/10* (2013.01); *C25D 17/001* (2013.01); *C25D 17/002* (2013.01); *C25D 17/06* (2013.01); *C25D 17/10* (2013.01); *C25D 21/14* (2013.01); *H01L 21/2885* (2013.01)

(58) Field of Classification Search
None
See application file for complete search history.

(56) References Cited

U.S. PATENT DOCUMENTS

| | | |
|---|---|---|
| 3,072,545 A | 1/1963 | Walter et al. |
| 3,658,470 A | 4/1972 | Zievers et al. |
| 4,469,564 A | 9/1984 | Okinaka et al. |
| 4,565,609 A | 1/1986 | Nobel et al. |
| 4,778,572 A | 10/1988 | Brown |
| 4,789,439 A | 12/1988 | Bunk et al. |

(Continued)

FOREIGN PATENT DOCUMENTS

| | | |
|---|---|---|
| EP | 471577 | 2/1992 |
| EP | 690934 | 6/1998 |

(Continued)

OTHER PUBLICATIONS

International Search Report issued Jul. 16, 2012 in PCT/US12/33422 filed Apr. 13, 2012.

(Continued)

*Primary Examiner* — Harry D Wilkins, III
(74) *Attorney, Agent, or Firm* — Rothwell, Figg, Ernst & Manbeck, P.C.

(57) ABSTRACT

Techniques disclosed herein include an electro-chemical deposition apparatus that provides an efficient circulation system, chemical management that provides reliable and uniform plating, and a configuration that provides short maintenance times and greater tool availability. Techniques include a processing tank containing an anolyte fluid, and one or more plating cells each having a catholyte fluid compartment with a circulation path that connects to a separate or remote catholyte reservoir. Thus, with such a configuration, a single pump can be used to flow catholyte (via manifolds) through one or more plating cells. Thus, with the catholyte reservoir maintained off board, instead of dumping catholyte over a weir into a reservoir, catholyte fluid—after flowing through a plating cell—is returned to the catholyte reservoir.

20 Claims, 7 Drawing Sheets

(56) References Cited

U.S. PATENT DOCUMENTS

| | | | |
|---|---|---|---|
| 4,789,444 A | 12/1988 | Watanabe et al. | |
| 4,832,812 A | 5/1989 | Brown | |
| 4,877,498 A | 10/1989 | Fukuda et al. | |
| 4,906,340 A | 3/1990 | Brown | |
| 5,039,576 A | 8/1991 | Wilson | |
| 5,112,447 A | 5/1992 | Gestaut et al. | |
| 5,162,079 A | 11/1992 | Brown | |
| 5,173,170 A | 12/1992 | Brown et al. | |
| 5,186,811 A | 2/1993 | Otani et al. | |
| RE34,191 E | 3/1993 | Brown | |
| 5,384,017 A | 1/1995 | Lumbroso | |
| 5,478,445 A | 12/1995 | Barker et al. | |
| 5,593,557 A | 1/1997 | Sopher et al. | |
| 5,715,133 A * | 2/1998 | Harrington et al. | 361/500 |
| 5,804,053 A | 9/1998 | Vaccaro et al. | |
| 5,883,762 A | 3/1999 | Calhoun et al. | |
| 5,976,341 A | 11/1999 | Schumacher et al. | |
| 6,099,713 A | 8/2000 | Yanada et al. | |
| 6,210,556 B1 | 4/2001 | Toben et al. | |
| 6,251,255 B1 | 6/2001 | Copping et al. | |
| 6,258,220 B1 * | 7/2001 | Dordi et al. | 204/198 |
| 6,261,433 B1 | 7/2001 | Landau | |
| 6,277,263 B1 | 8/2001 | Chen | |
| 6,299,753 B1 | 10/2001 | Chao et al. | |
| 6,365,017 B1 | 4/2002 | Hongo et al. | |
| 6,368,475 B1 | 4/2002 | Hanson et al. | |
| 6,379,520 B1 | 4/2002 | Kuriyama et al. | |
| 6,503,375 B1 | 1/2003 | Maydan et al. | |
| 6,527,920 B1 | 3/2003 | Mayer et al. | |
| 6,531,039 B2 | 3/2003 | Kohut | |
| 6,576,110 B2 | 6/2003 | Maydan | |
| 6,607,653 B1 | 8/2003 | Tsuji et al. | |
| 6,632,335 B2 | 10/2003 | Kunisawa et al. | |
| 6,660,137 B2 | 12/2003 | Wilson et al. | |
| 6,755,960 B1 * | 6/2004 | Frischauf et al. | 205/246 |
| 6,793,794 B2 | 9/2004 | Hongo et al. | |
| 6,875,331 B2 | 4/2005 | Herchen | |
| 6,878,258 B2 | 4/2005 | Kovarsky | |
| 6,878,368 B2 | 4/2005 | Ohta et al. | |
| 6,890,416 B1 | 5/2005 | Mayer et al. | |
| 6,923,899 B2 | 8/2005 | Brown et al. | |
| 7,012,333 B2 | 3/2006 | Shimoyama et al. | |
| RE39,123 E | 6/2006 | Kuriyama et al. | |
| 7,128,823 B2 | 10/2006 | Yang et al. | |
| 7,151,049 B2 | 12/2006 | Beica et al. | |
| 7,195,702 B2 | 3/2007 | Bokisa, Sr. et al. | |
| 7,247,222 B2 | 7/2007 | Yang et al. | |
| 7,264,698 B2 | 9/2007 | Hanson et al. | |
| 7,264,704 B2 | 9/2007 | Nevosi et al. | |
| 7,273,535 B2 | 9/2007 | Kovarsky et al. | |
| 7,351,314 B2 | 4/2008 | Klocke et al. | |
| 7,351,315 B2 | 4/2008 | Klocke et al. | |
| 7,387,717 B2 | 6/2008 | Kunisawa et al. | |
| 7,387,964 B2 | 6/2008 | So et al. | |
| 7,393,439 B2 | 7/2008 | McHugh et al. | |
| 7,402,227 B2 | 7/2008 | Yoshioka et al. | |
| 7,427,338 B2 | 9/2008 | Dordi et al. | |
| 7,585,398 B2 | 9/2009 | Hanson et al. | |
| 7,628,898 B2 | 12/2009 | Klocke et al. | |
| 7,713,859 B2 | 5/2010 | Richardson et al. | |
| 7,794,573 B2 | 9/2010 | Klocke | |
| 8,012,332 B2 | 9/2011 | Yoshioka et al. | |
| 8,029,653 B2 | 10/2011 | Yamamoto et al. | |
| 8,377,283 B2 * | 2/2013 | Eckles et al. | 205/244 |
| 8,603,305 B2 * | 12/2013 | Rash et al. | 204/237 |
| 2002/0027080 A1 | 3/2002 | Yoshioka et al. | |
| 2002/0032499 A1 | 3/2002 | Wilson et al. | |
| 2003/0000844 A1 | 1/2003 | Carl et al. | |
| 2003/0201170 A1 | 10/2003 | Gandikota et al. | |
| 2003/0201184 A1 | 10/2003 | Dordi et al. | |
| 2004/0000491 A1 | 1/2004 | Kovarsky et al. | |
| 2004/0016637 A1 * | 1/2004 | Yang et al. | 204/242 |
| 2004/0016647 A1 | 1/2004 | Yang et al. | |
| 2004/0026255 A1 | 2/2004 | Kovarsky et al. | |
| 2004/0065543 A1 | 4/2004 | Kovarsky | |
| 2004/0134775 A1 | 7/2004 | Yang et al. | |
| 2004/0222085 A1 * | 11/2004 | Mohanta et al. | 204/252 |
| 2005/0009260 A1 | 1/2005 | Kim et al. | |
| 2005/0092601 A1 | 5/2005 | Herchen | |
| 2005/0092602 A1 | 5/2005 | Herchen | |
| 2005/0121317 A1 | 6/2005 | Klocke et al. | |
| 2005/0133364 A1 | 6/2005 | Leonida | |
| 2005/0173253 A1 | 8/2005 | Huang | |
| 2006/0102467 A1 | 5/2006 | Herchen et al. | |
| 2006/0108228 A1 | 5/2006 | Kovarsky et al. | |
| 2006/0113006 A1 | 6/2006 | Masuda et al. | |
| 2006/0157355 A1 | 7/2006 | Baskaran et al. | |
| 2006/0237323 A1 | 10/2006 | Baskaran et al. | |
| 2007/0023280 A1 * | 2/2007 | Eckles et al. | 204/232 |
| 2007/0037005 A1 | 2/2007 | Heber et al. | |
| 2007/0037377 A1 | 2/2007 | Richardson et al. | |
| 2007/0068819 A1 | 3/2007 | Singh et al. | |
| 2007/0068820 A1 | 3/2007 | Baskaran et al. | |
| 2007/0246350 A1 | 10/2007 | Togashi | |
| 2008/0105555 A1 | 5/2008 | Iwazaki | |
| 2008/0217182 A1 | 9/2008 | Dai | |
| 2008/0245669 A1 | 10/2008 | Yoshioka et al. | |
| 2010/0038255 A1 | 2/2010 | Lee et al. | |
| 2010/0206735 A1 | 8/2010 | Wurm et al. | |
| 2010/0212694 A1 * | 8/2010 | Keigler | 134/18 |
| 2011/0031112 A1 | 2/2011 | Birang et al. | |
| 2011/0073483 A1 | 3/2011 | Hafezi et al. | |
| 2011/0226614 A1 | 9/2011 | Rash et al. | |
| 2012/0298502 A1 | 11/2012 | Papapanayiotou et al. | |
| 2012/0298504 A1 * | 11/2012 | Guarnaccia et al. | 204/252 |
| 2013/0081941 A1 | 4/2013 | Yoshioka et al. | |
| 2013/0112563 A1 | 5/2013 | Tomantschger et al. | |
| 2014/0166492 A1 * | 6/2014 | Shimoyama | C25D 21/14 205/82 |

FOREIGN PATENT DOCUMENTS

| | | |
|---|---|---|
| GB | 1 293 648 | 10/1972 |
| GB | 293648 | 10/1972 |
| JP | 51-44527 | 4/1976 |
| JP | 51044527 | 4/1976 |
| JP | 63-216998 A | 9/1988 |
| JP | 63216998 | 9/1988 |
| JP | 2-70087 A | 3/1990 |
| JP | 2-239611 A | 9/1990 |
| JP | 22239611 | 9/1990 |
| JP | 3039500 | 6/1991 |
| JP | 5-179496 A | 7/1993 |
| JP | 5179496 | 7/1993 |
| JP | 5-302199 A | 11/1993 |
| JP | 5302199 | 11/1993 |
| JP | 6-158397 A | 6/1994 |
| JP | 6158397 | 6/1994 |
| JP | 6-280098 A | 10/1994 |
| JP | 6280098 | 10/1994 |
| JP | 6-336700 A | 12/1994 |
| JP | 6336700 | 12/1994 |
| JP | 7-26239 B2 | 3/1995 |
| JP | 7-108458 A | 4/1995 |
| JP | 7108458 | 4/1995 |
| JP | 7-211669 A | 8/1995 |
| JP | 7211669 | 8/1995 |
| JP | 7-236827 A | 9/1995 |
| JP | 7236827 | 9/1995 |
| JP | 7-300699 A | 11/1995 |
| JP | 7300699 | 11/1995 |
| JP | 2070087 | 7/1996 |
| JP | 9-165699 A | 6/1997 |
| JP | 9165699 | 6/1997 |
| JP | 9-509222 A | 9/1997 |
| JP | 9509222 | 9/1997 |
| JP | 10116758 | 5/1998 |
| JP | 10121297 | 5/1998 |
| JP | 10199814 | 7/1998 |
| JP | 10204695 | 8/1998 |
| JP | 03039500 | 5/2000 |
| JP | 2000160390 | 6/2000 |
| JP | 2000160399 | 6/2000 |
| JP | 2000219993 | 8/2000 |

(56) References Cited

FOREIGN PATENT DOCUMENTS

| | | | | |
|---|---|---|---|---|
| JP | 2006322069 | | 11/2006 | |
| JP | 2014-118578 A | * | 6/2014 | ............. C25D 17/00 |
| WO | 90/15171 A1 | | 12/1990 | |
| WO | WO9015171 | | 12/1990 | |
| WO | 99/25902 A1 | | 5/1999 | |
| WO | WO9925902 | | 5/1999 | |

OTHER PUBLICATIONS

Written Opinion issued Jul. 16, 2012 in PCT/US12/33422 filed Apr. 13, 2012.

Notification of Transmittal (PCT/ISA/220), International Search Report (PCT/ISA/210), and Written Opinion (PCT/ISA/237), mailed Jan. 21, 2015 in corresponding PCT/US 14/63828 (8 pages).

* cited by examiner

ELECTROCHEMICAL DEPOSITION APPARATUS WITH REMOTE CATHOLYTE FLUID MANAGEMENT

BACKGROUND OF THE INVENTION

This invention relates to methods and systems for electro-chemical deposition including electroplating of semiconductor substrates.

Electro-chemical deposition, among other processes, is used as a manufacturing technique for the application of films to various structures and surfaces, such as to semiconductor wafers and silicon work pieces or substrates. Such films can include tin silver, nickel, copper or other metal layers. Electro-chemical deposition involves positioning a substrate within a solution that includes metal ions, and then applying an electrical current to cause metal ions from the solution to be deposited on the substrate. Typically, electrical current flows between two electrodes, namely, between a cathode and an anode. When a substrate is used as the cathode, metal can be deposited thereon. A plating solution can include one or more metal ion types, acids, chelating agents, complexing agents, and any of several other types of additives that assist with plating a particular metal. Such additives can help enable adhesion and uniform plating, and reduce film stress, among other benefits. As plating occurs, metal from the plating solution is consumed and thus needs to be replaced to continue electro-chemical deposition operations.

SUMMARY

An important feature of systems used for electro-chemical deposition is their ability to produce films with uniform and repeatable characteristics such as film thickness, composition, and profile relative to an underlying workpiece profile. Electro deposition systems can use a primary electrolyte (process electrolyte) that requires replenishment upon depletion. By way of example, in tin silver applications a tin salt solution liquid replenishment may be required upon depletion. Such replenishment may be expensive as a function of the application and may require significant down time of the electro deposition tool or sub module for service and process re-qualification, which adversely affects the cost of ownership of the deposition tool.

Conventional electro-chemical deposition tools include a processing tank containing a process electrolyte (catholyte). Substrates or wafers can then be lowered into the tank. In some configurations, an anode is positioned on a sidewall of the processing tank. Such a configuration is typically limiting because only one substrate in the processing tank can be plated. To increase yield, conventional electro-chemical deposition tools use multiple plating cells positioned within a tank of catholyte fluid, with each plating cell including an anode and a sealed anolyte fluid chamber combination, as well as openings in the plating cell for catholyte to circulate through the cell and across a substrate to be plated. Typically, catholyte is flowed from openings at a bottom of the plating cell across a vertically held wafer. The flow of catholyte fluid then spills over a linear weir, at the top of the plating cell, back into the processing tank of catholyte fluid to be reflowed across the substrate.

Such a conventional configuration with a flow-over weir, however, has some drawbacks. One drawback is the need of many pumps. For example, plating cells are often configured to plate two substrates simultaneously. In such a configuration, a wafer holder holds a substrate on opposite sides, and is then positioned within the plating cell. This configuration then requires an anode on opposite sides of the plating cell (one anode for each substrate). Having two anodes means having to circulate anolyte through two separate anolyte fluid chambers in the plating cell, as well as having to circulate catholyte fluid up through each plating cell. Thus, at least three pumps, pumping systems, or circulation paths and flow meters are needed for such a configuration.

Techniques disclosed herein include an electro-chemical deposition apparatus that provides a simplified circulation system, better chemical management for more reliable and uniform plating, as well as short maintenance times for greater tool availability. Techniques include a processing tank containing an anolyte fluid, and one or more plating cells each having a catholyte fluid compartment having a circulation path that connects to a separate or remote catholyte reservoir. The anolyte fluid is not the process electrolyte and needs substantially less maintenance as compared to the catholyte fluid that needs constant replenishment of metal ions and other additives. Thus, with such a configuration as disclosed herein, a single pump can be used to flow catholyte (via manifolds) through one or more plating cells. The anolyte fluid in the processing tank can circulate inherently via fluid diffusion, or there can be an optional flow mechanism in the processing tank. Thus, with the catholyte reservoir maintained off board, instead of dumping catholyte over a weir into a reservoir, catholyte fluid—after flowing through a plating cell—is returned to the catholyte reservoir. Having the catholyte reservoir at a remote location (for example, in a module adjacent to an electro-chemical deposition tool or in a sub-fab below a clean room) enables better catholyte management capabilities. Other benefits include easier replacement of ion exchange membranes as no pressure seals need to be broken, and enabling use of insoluble anodes and flexibility in configuring anodes such as using multi-zone anodes.

One embodiment is an electrochemical deposition (ECD) apparatus for depositing metal onto a substrate. The electrochemical deposition apparatus includes a processing tank configured for holding an anolyte fluid. The processing tank is sized sufficiently to receive one or more processing cells via a top opening of the processing tank. The apparatus also includes an electrochemical plating cell sized and configured to be removably inserted into the processing tank. The electrochemical plating cell has a catholyte fluid compartment configured to hold catholyte fluid. The catholyte fluid compartment provides a fluid boundary between anolyte fluid in the processing tank and catholyte fluid in the electrochemical plating cell. An ion exchange membrane is removably coupled to the electrochemical plating cell. The ion exchange membrane provides a portion of the fluid boundary separating anolyte fluid in the processing tank from catholyte fluid in the electrochemical plating cell. The apparatus includes an anode removably positioned within the processing tank. The anode is positioned adjacent to the ion exchange membrane. The anode is also positioned at a sufficient distance from the ion exchange membrane to permit anolyte fluid to flow between the anode and the ion exchange membrane. A substrate holder configured to removably hold a substrate is also configured to be removably inserted into the catholyte fluid compartment of the electrochemical plating cell such that the substrate is in contact with the catholyte fluid. A catholyte fluid circulation system is configured to be able to pump catholyte fluid from a catholyte reservoir to the electrochemical plating cell such that catholyte fluid flows across a surface of the substrate. The catholyte reservoir is located at a location remote from the processing tank. An electrical system is connected to the ECD apparatus and configured to generate a current between the anode and the substrate such that metal ions within the catholyte fluid can be deposited on the substrate.

Another embodiment includes a method of electro-chemical deposition. Such a method includes maintaining an anolyte fluid in a processing tank sized sufficiently to receive one or more processing cells via a top opening of the processing tank. Removably positioning an electrochemical plating cell within the processing tank. The electrochemical plating cell having a catholyte fluid compartment configured to hold catholyte fluid and which provides a fluid boundary between anolyte fluid in the processing tank and catholyte fluid in the electrochemical plating cell. The ECD cell also includes an ion exchange membrane removably coupled to the electrochemical plating cell. Removably positioning an anode within the processing tank and adjacent to an ion exchange membrane so that the anode is positioned at a sufficient distance from the ion exchange membrane to permit anolyte fluid to flow between the anode and the ion exchange membrane. Removably positioning a substrate holder into the catholyte fluid compartment of the electrochemical plating cell such that the substrate is in contact with the catholyte fluid. Circulating catholyte fluid from a remote catholyte reservoir to the electrochemical plating cell such that catholyte fluid flows across a surface of the substrate. Generating a current between the anode and the substrate such that metal ions within the catholyte fluid are deposited on the substrate.

The systems and techniques disclosed herein provide several advantages. Simplified anolyte flow management eliminates the cost and complexity of conventional anolyte flow management. Moreover, having metal generation in an off board unit, combined with evaporation and dosing, provides easier management of metal concentration.

Of course, the order of discussion of the different steps and features as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein include an electro-chemical deposition apparatus that provides a simplified circulation system, better chemical management for more reliable and uniform plating, as well as short maintenance times for greater tool availability. Techniques include a processing tank containing an anolyte fluid, and one or more plating cells each having a catholyte fluid compartment having a circulation path that connects to a separate or remote catholyte reservoir. The anolyte fluid is not the process electrolyte and needs substantially less maintenance as compared to the catholyte fluid that needs constant replenishment of metal ions and other additives. Thus, with such a configuration as disclosed herein, a single pump can be used to flow catholyte (via manifolds) through one or more plating cells. The anolyte fluid in the processing tank can circulate via inherent fluid diffusion, or the apparatus can include an optional flow mechanism in the processing tank such as a recirculation pump within the reservoir. Thus, with the catholyte reservoir maintained off board, instead of dumping catholyte over a weir into a reservoir, catholyte fluid—after flowing through a plating cell—is returned to the catholyte reservoir.

Figure 1:
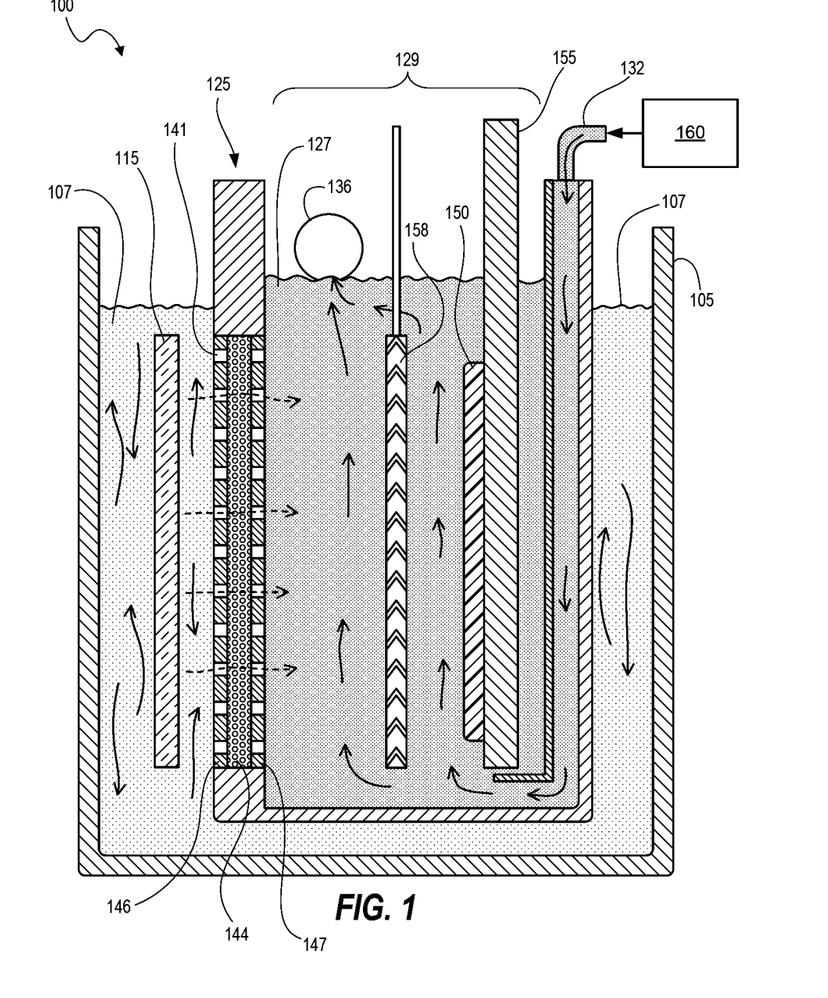
FIG. 1 is a cross-sectional schematic view of an electro-chemical deposition processing tank and plating cell positioned therein.

Systems and techniques disclosed herein can be embodied as an electroplating tool or module of an electroplating tool. Example systems can include semiconductor fabrication tools such as used in a clean room. One embodiment includes an electrochemical deposition apparatus for depositing metal onto a substrate. FIG. 1 shows a cross-sectional schematic view of an example electrochemical deposition apparatus 100. Electrochemical deposition apparatus 100 includes a processing tank 105 configured for holding an anolyte fluid 107. Processing tank 105 is sized sufficiently to receive one or more processing cells via a top opening of the processing tank. Note that an upper portion of processing tank 105 is open such that one or more cells or modules can be lowered into processing tank 105. The electrochemical deposition apparatus 100 includes an electrochemical plating cell 125. Electrochemical plating cell 125 is sized and configured to be removably inserted into the processing tank 105. The electrochemical plating cell 125 defines a catholyte fluid compartment 129 configured for holding a catholyte fluid. The catholyte fluid compartment 129 provides a fluid boundary between anolyte fluid 107 in the processing tank 105 and catholyte fluid 127 in the electrochemical plating cell 125. The schematic shows that these two fluids are separated by structures of electrochemical plating cell 125.

The electrochemical plating cell 125 can include a catholyte fluid inlet 132 positioned at an upper portion of the electrochemical plating cell 125. Catholyte fluid can be flowed into catholyte fluid inlet 132 from a chemical management system 160. A catholyte fluid outlet 136 can be positioned at the upper portion of the electrochemical plating cell 125. The electrochemical plating cell defines a catholyte fluid flow path from the catholyte fluid inlet 132 to a bottom portion of the electrochemical plating cell, up through the plating cell and then into the catholyte fluid outlet 136. Note that arrows shown within catholyte fluid 127 illustrate a general flow path of the catholyte fluid within electrochemical plating cell 125. Although the catholyte fluid inlet 132 and ion exchange membrane 144 are shown on opposite sides of the electrochemical plating cell 125, some embodiments can have the catholyte fluid inlet 132 and ion exchange membrane 144 on a same side. For example, catholyte fluid can flow down a pathway along an edge of the ion exchange membrane 144, and then underneath the ion exchange membrane 144 to exit via a manifold and outlets along a bottom portion of electrochemical plating cell 125. This configuration will be shown later in FIG. 6.

The electrochemical deposition apparatus 100 includes an ion exchange membrane 144 removably coupled to the electrochemical plating cell 125. The ion exchange membrane 144 provides a portion of the fluid boundary separating anolyte fluid 107 in the processing tank 105 from catholyte fluid 127 in the electrochemical plating cell 125. Various different types of ion exchange membranes can be selected, such as anionic membranes or cationic membranes. A given ion exchange membrane can selectively allow certain ions to pass from one solution to another, while preventing other ions or agents from crossing the membrane. Note that the ion exchange membrane 144 fills an opening in a sidewall of the electrochemical plating cell 125. In other words, the ion exchange membrane 144 functions as one surface or wall of the electrochemical plating cell 125.

The electrochemical plating cell 125 in FIG. 1 is shown in a simplified configuration for convenience in describing example embodiments. This simplified configuration can be used for plating a single surface or substrate. Other embodiments, however, can be configured to plate on multiple substrates simultaneously. Such configurations can include a first ion exchange membrane on a first side of the electrochemical plating cell, and a second ion exchange membrane on a second side of the electrochemical plating cell, with the second side being opposite to the first side.

The electrochemical plating cell 125 can include a membrane support mechanism 146/147 configured to structurally support opposite sides of the ion exchange membrane 144 while defining openings 141 that permit ion flow through the ion exchange membrane. By way of example, the membrane support mechanism 146/147 can be an array of vertical or horizontal slats. Alternately, the support mechanism can be embodied as a grid structure or other generally rigid support having an array of openings 141. Openings 141 in the support mechanism 146/147 allow certain ions in contact with the ion exchange membrane to pass through the ion exchange membrane 144 from one electrolyte to another electrolyte. The physical support members prevent unwanted flexing of, or damage to, the ion exchange membrane 144. The ion exchange membrane 144 can be relatively flexible but have low strength compared to the fluid forces acting on the membrane. If either the anolyte fluid 107 or catholyte fluid 127 is missing from the apparatus, then fluid forces pressing on one side could break the ion exchange membrane 144 in the absence of physical support structure. More details on a suitable membrane support mechanism, ion exchange membrane, and electroplating in general can be found in U.S. Patent Application Publication Number 2012/0298504 (Guarnaccia) entitled "Electro Chemical Deposition and Replenishment Apparatus," published on Nov. 29, 2012, which is hereby incorporated by reference in its entirety.

The electrochemical deposition apparatus 100 includes an anode 115 that can be removably positioned within the processing tank 105. The anode 115 is positioned adjacent to the ion exchange membrane and positioned at a sufficient distance from the ion exchange membrane to permit anolyte fluid flow between the anode 115 and the ion exchange membrane 144. Note that solid line arrows shown within anolyte fluid 107 show example flow within processing tank 105. Because anolyte fluid 107 needs little maintenance compared the catholyte fluid, in some embodiments natural fluid diffusion can provide circulation of anolyte fluid. In other embodiments a pump (not shown) or similar mechanism can be used to circulate or flow anolyte fluid within processing tank 105. Dashed line arrows show example ion flow from anode 115, through openings 141 defined by membrane support mechanism 146/147 and through ion exchange membrane 144 into the catholyte fluid 127.

In some embodiments, anode 115 is removable from the processing tank independent of the electrochemical plating cell. For example, anode 115 can be raised and lowered separate from the electrochemical plating cell 125. In other embodiments, the anode 115 is mechanically coupled to the electrochemical plating cell 125 such that anode 115 is removable from the processing tank with the electrochemical plating cell. For example, the anode 115 can be affixed to the electrochemical plating cell 125 using spacers to create openings for entry of anolyte fluid 107, from the processing tank 105, to fill a space between the ion exchange membrane 144 and anode 115. In embodiments that use a double-sided substrate holder, the anode can include a first anode on a first side of the electrochemical plating cell 125, and a second anode on a second side of the electrochemical plating cell 125, with the second side being opposite to the first side.

Figure 5:
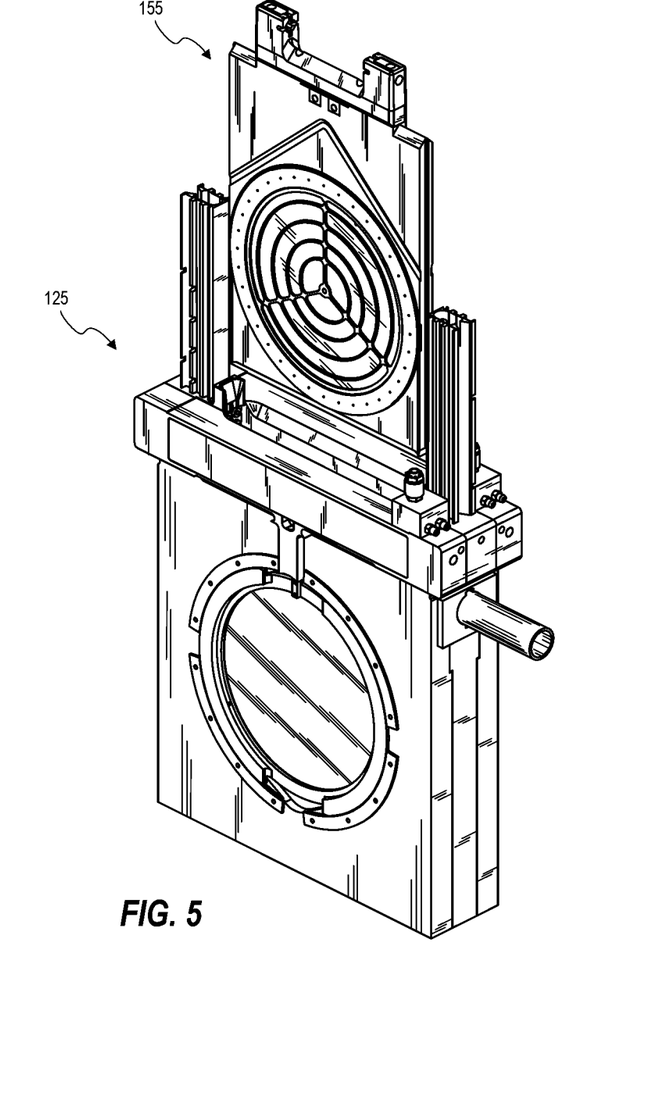
FIG. 5 is a perspective view of an electro-chemical deposition plating cell and substrate holder.

The apparatus includes a substrate holder 155 configured to removably hold a substrate 150. The substrate holder 155 is configured to be removably inserted into the catholyte fluid compartment 129 of the electrochemical plating cell 125 such that the substrate is in contact with the catholyte fluid 127. In some embodiments, the substrate holder 155 can be configured to hold a substrate 150 on each of opposite sides of the substrate holder 155. FIG. 5 shows a perspective view of an example electrochemical plating cell 125 and double-sided substrate holder. In FIG. 5, the substrate holder 155 is show positioned above a top opening of the electrochemical plating cell 125. The substrate holder 155 can be lowered vertically into catholyte fluid 127 contained within electrochemical plating cell 125. Movement of the substrate holder can be executed by a robotic movement system (not shown). Any overflow fluid from substrate holder insertion can exit the catholyte fluid compartment 129 via catholyte fluid outlet 136, which can be a gravity return to chemical management system 160.

An agitation mechanism 158 can be embodied as a shear plate. Agitation mechanism 158 can be configured to agitate catholyte fluid 127 at the surface of the substrate 150. Such agitation promotes uniform plating and helps ions and agents flow to all substrate surfaces and features.

The apparatus also includes a catholyte fluid circulation system configured to pump catholyte fluid 127 from a catholyte reservoir to the electrochemical plating cell 125 such that catholyte fluid 127 flows across a surface of the substrate 150 to enable uniform plating. The catholyte reservoir is located remote from the plating processing tank. The remote location can be, for example, an adjacent tool, a chemical supply system in a sub fab, basement, adjacent room, etc. A pump or pumping system to circulate fluids can be located at the electrochemical plating cell 125 or at the chemical management system 160. Various processes can be executed in the circulation loop, such as filtering, dosing, temperature control, bleed and feed, sampling, and initial bath make up. Having one or more relatively large reservoirs off board can result in less micro contamination as compared to conventional techniques.

Figure 2:
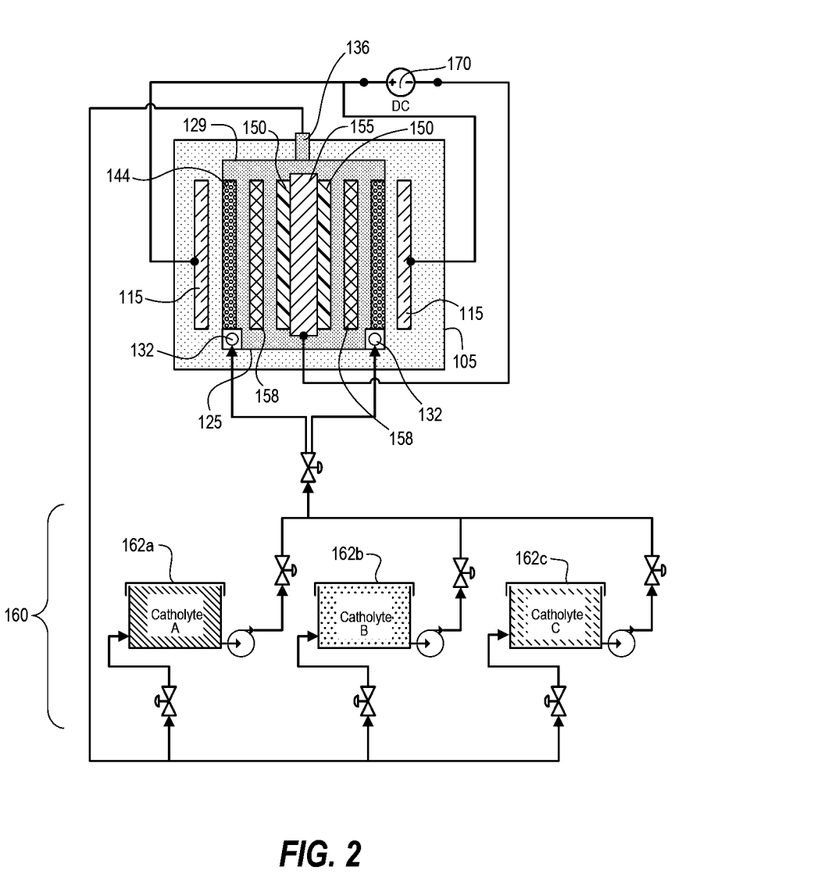
FIG. 2 is a schematic view of an electro-chemical deposition apparatus according to embodiments as described herein.

FIG. 2 shows a schematic of an example apparatus as disclosed herein. Shown in FIG. 2 is chemical management system 160, processing tank 105, and electrochemical plating cell 125 with accompanying components. Note that the chemical management system 160 can include catholyte reservoirs 162a, 162b, and 162c, as well as corresponding conduits to deliver on or more fluids to catholyte fluid compartment 129. These remote or off board reservoirs can have the same bath chemistry or different bath chemistries. For example, there could be a process bath reservoir, redistribution layer bath, and baths of a same metal but having different additive concentrations. For example different plating processes are used when plating for through silicon vias (TSV) as compared to plating solder bumps in that corresponding process solutions used for each application can have different concentrations of additives.

Various valves and flow controllers can be used to manage fluid delivery. The catholyte fluid circulation system can include a flow controller configured to stop flow of catholyte fluid 127 into the catholyte fluid compartment 129 prior to removing the substrate holder 155 from the electrochemical plating cell 125. In some embodiments the catholyte fluid compartment 129 can be relatively small compared to the substrate holder 155 and accompanying substrates 150. As such, inserting the substrate holder 155 into catholyte fluid compartment 129 can cause significant displacement of catholyte fluid 127. To prevent catholyte fluid 127 from spilling over a top opening or upper emergency weir, catholyte fluid flow can be stopped prior to wafer holder 155 removal, thus ensuring that the catholyte fluid level will remain at an appropriate level for subsequent insertion of substrate holder 155. The flow controller can then be configured to restart flow of catholyte fluid 127 into the catholyte fluid compartment 129 after inserting the substrate holder 155 into the electrochemical plating cell 125.

Figure 3:
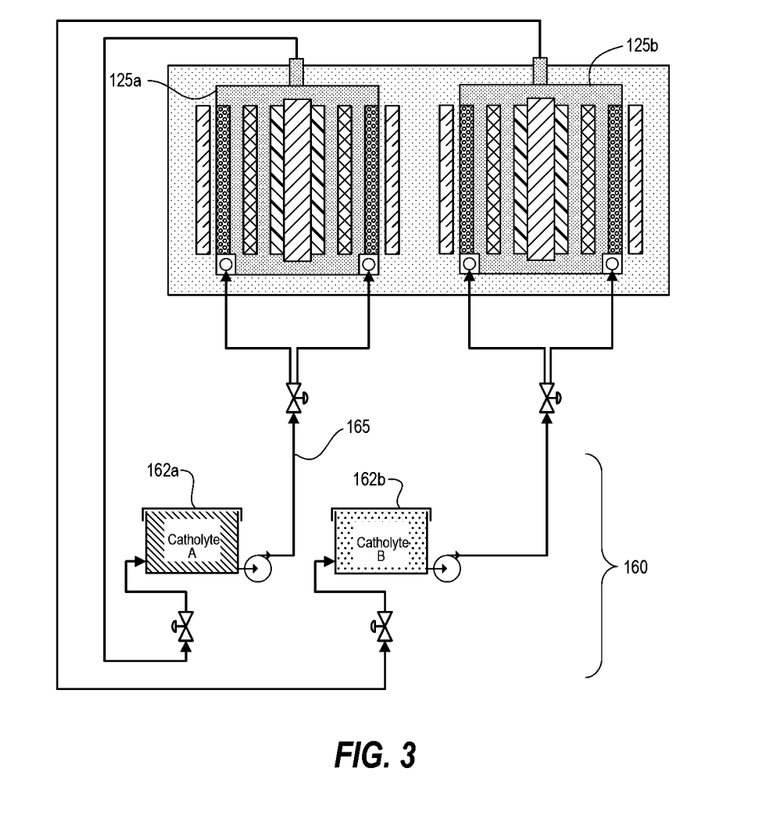
FIG. 3 is a schematic view of an embodiment of an electro-chemical deposition apparatus according to embodiments as described herein.

Referring now to FIG. 3, the catholyte fluid circulation system can include a first catholyte conduit 165 that supplies a first catholyte fluid to a first electrochemical plating cell 125a, and a second catholyte conduit 166 that supplies a second catholyte fluid to a second electrochemical plating cell 125b. In this configuration the first catholyte fluid and the second catholyte fluid are different from each other, while both the first electrochemical plating cell 125a and the second electrochemical plating cell 125b are positioned in the processing tank 105 having anolyte fluid 107, which can be a single fluid. In such an embodiment, one plating cell could be used to deposit tin, while another plating cell—used simultaneously—applies copper to a separate substrate. In another embodiment, the first catholyte fluid and the second catholyte fluid differ from each other in that each fluid has a different additive concentration. For example, a solution with a first additive concentration can be used for plating an initial layer or seed layer, and then the catholyte fluid is switched to the second concentration used to complete a plating operation, for example, filling trenches and vias having a seed layer. The catholyte fluid circulation system can be configured to selectively pump from one or more different catholyte reservoirs to one or more electrochemical plating cells residing in the processing tank. The catholyte fluid circulation system is configured to remove catholyte fluid from the electrochemical plating cell during idle periods of electrochemical plating activity. The apparatus includes an electrical system configured to generate a current between the anode 115 and the substrate 150 such that metal ions within the catholyte fluid 127 are deposited on the substrate 150.

Figure 4:
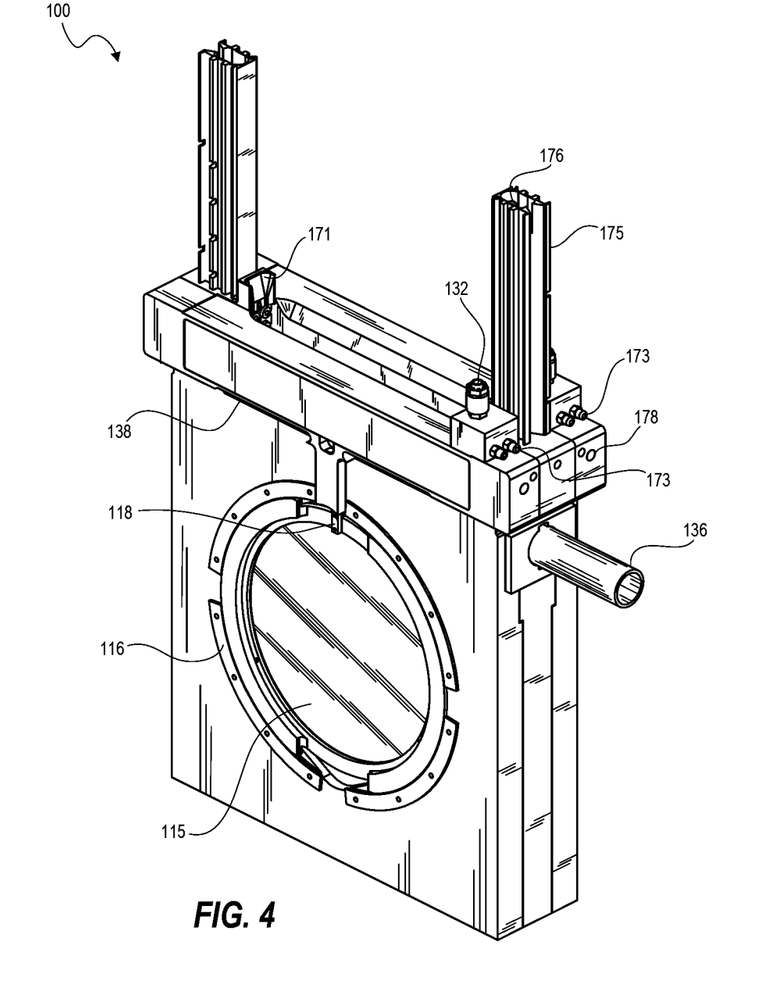
FIG. 4 is a perspective view of an electro-chemical deposition plating cell.

FIGS. 4 and 5 show a perspective view of an example electrochemical plating cell 125 that can be positioned within a processing tank of a plating tool or system. An example anode 115 (backside) is removably mounted on the electrochemical plating cell 125 via assembly holder 116. Electrical contact 118 supplies an electrical current to anode 115. Piston pneumatic connection 173 can be used to create and release electrical contact with the substrate holder 155. Substrate holder glide 171 can be used to assist with insertion of substrate holder 155. Holes 178 can be used by a lifting mechanism to remove the electrochemical plating cell 125 from a processing tank, such as for changing anodes and membranes. Catholyte fluid inlet 132 can deliver catholyte fluid to the electrochemical plating cell 125. Fluid can travel down a conduit within the cell and through a distribution system or manifold near the bottom of the electrochemical plating cell 125 to flow up through the catholyte fluid compartment 129 and out catholyte fluid outlet 136. An optional overflow weir 138 can let excess catholyte fluid flow into the anolyte fluid in emergency situations. A shear plate or shear plate pair (agitation mechanism) positioned within electrochemical plating cell 125 can be agitated via a linear motor 176 or other means of movement. Heat sink 175 can be used to dissipate heat generated from linear motor 176.

Figure 6:
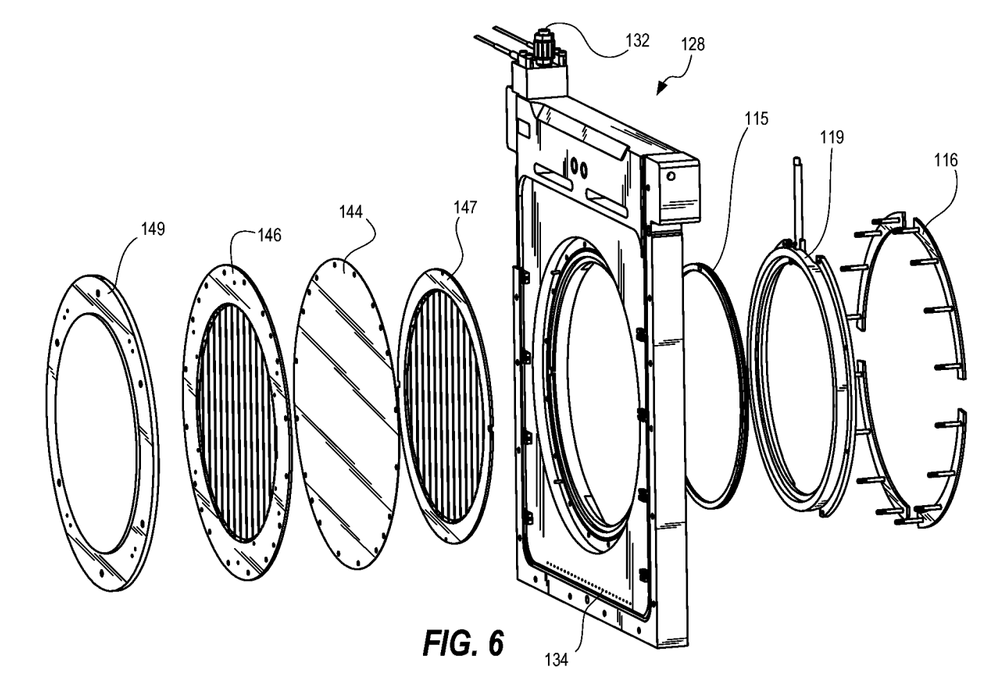
FIG. 6 is an exploded perspective view of a portion of an electro-chemical deposition plating cell.

FIG. 6 shows an exploded view of components from one side of an example electrochemical plating cell 125. Assembly holder 116 can include threaded extensions to hold together several components. Anode support ring 119 provides physical support for an anode as well as an electrical interface. Anode 115 can be sized to fit within anode support ring 119. Frame 128 provides support for the anode and membrane assembly, as well as fluid conduits for catholyte fluid 127. For example, catholyte fluid 127 can enter frame 128 via catholyte fluid inlet 132. Catholyte fluid 127 flows downwardly through a side of frame 128 and then out through distribution openings 134, which can be created as cross bores. After exiting distribution openings 134, catholyte fluid 127 can flow upwardly (within electrochemical plating cell 125) across substrate 150. Membrane support mechanism 146/147 is shown embodied as an array of vertical support members to support ion exchange membrane 144. Shield plate 149 can function as a shield and assist with electrical shaping. Note that various O-rings and seals can be used when assembling the various components, such as to prevent fluid from leaking around the ion exchange membrane.

This configuration provides benefits. By mounting ion exchange membranes on a removable electrochemical plating cell, ion exchange membranes can be easily replaced. Depending on a type of membrane used, replacement can be needed every six months or so. Also, with the anode being removable by using anolyte fluid from the processing tank, there is no need to break sealing connections to replace the anode (which could be inert or soluble). While insoluble anodes can last months or years, soluble anodes may need to be replaced every month or so. The anode can be positioned using various quick-release mechanisms for easy replacement. Another benefit is that no pressure vessel is needed. Conventional designs can include a pair of anolyte pressure vessels. With techniques herein, however, the anolyte can reside in an open-top processing tank. With respect to the catholyte fluid, although the catholyte fluid is pumped to the electrochemical plating cell, the catholyte fluid enters the catholyte fluid compartment, which can have an open top and gravity return outlet.

Figure 7:
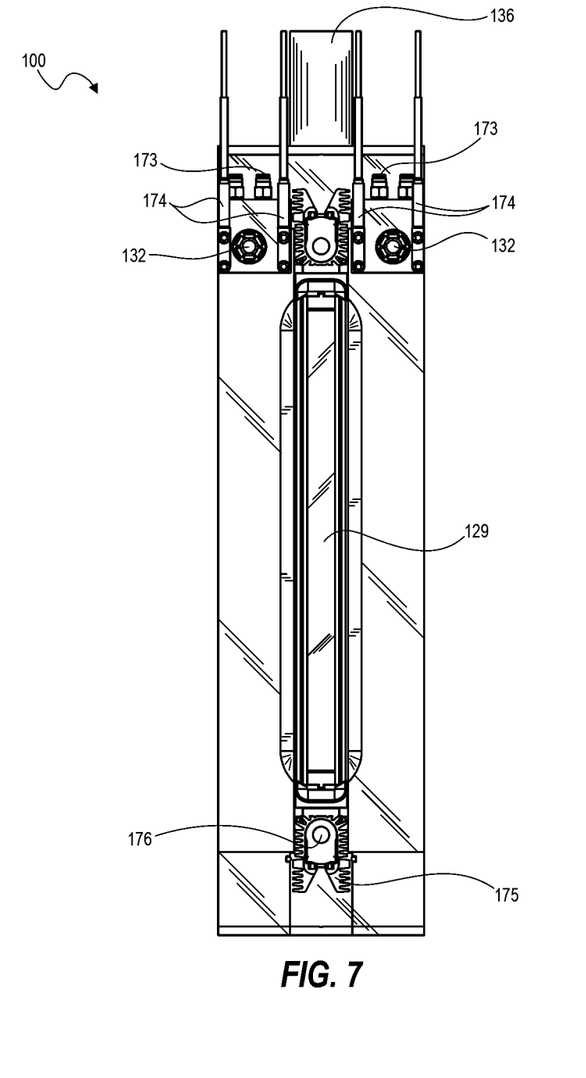
FIG. 7 is a top view of an example electro-chemical deposition plating cell.

FIG. 7 shows a top view of an example electrochemical plating cell 125. Electrical connections 174 (not shown in FIGS. 4 and 5) can be used to deliver a current to the anodes and/or wafer holder. Catholyte fluid compartment 129 can retain catholyte fluid 127 and receive substrate holder 155. Other identified features in this view have been described previously.

With such a top-loading mechanism that lowers a substrate holder and substrate pair into a relatively small catholyte fluid compartment, displacement of the catholyte fluid can be a concern. For example, the catholyte fluid compartment may contain approximately 5-10 liters, while a remote reservoir contains 50-60 liters. To prevent overflow of catholyte fluid during insertion of a substrate holder, several techniques can be used, such as controlling the speed of insertion so that the fluid outlet can handle the temporary flow surge. Another technique includes temporarily pausing pumping of catholyte fluid into the catholyte fluid compartment. If an inflow is temporarily shut off while a substrate holder is contained within the electrochemical plating cell, then, upon removing the substrate holder, a fluid surface level will drop, usually below the fluid outlet. Keeping inflow shut off will prevent catholyte fluid from rising up to the fluid outlet before another substrate holder is inserted, thereby avoiding potential overflow from substrate holder insertion. In other embodiments, catholyte fluid flow can be reversed during substrate holder insertion and removal from the electrochemical plating cell.

Although in most of the example figures the anode is attached to the electrochemical plating cell, other embodiments can have the anode mounted independent of the electrochemical plating cell, such as with a removable frame specifically for the anode, or by mounting to walls of the processing tank. With this configuration, the catholyte cell bounded by membranes can be removed independently of the anodes. Embodiments using an insoluble anode are beneficial in that an insoluble anode can have multiple electrical connections for multiple electrical zones of the anode. Flexibility in configuring the anode is beneficial to tailoring the electrical field. Other advantages are mechanical in fabrication.

The configurations disclosed herein provide even more advantages. For example, having the chemical management system 160 in a sub fab is beneficial for performing leaching in a process tank reservoir. Some conventional plating operations can require a weekly dump of the process electrolyte. Unfortunately there is a significant amount of time required to change out chemistry. Conventionally, these chemistry management operations can be an all-day activity, which severely decreases throughput. With configurations herein, however, a quick bath source switch can be made to a newly made up bath while a used bath is treated and/or dumped. Thus, off-board chemistry maintenance can be completed within hours without interrupting particular plating operations, thereby increasing or maintaining yield. With conventional systems that have a (large) processing tank full of process electrolyte in which plating cells are positioned, cleaning such systems involves many steps and interruption of plating. For example, conventionally there are several steps in bath maintenance operations. These can include draining a cell and reservoir of anolyte and catholyte, removing anode holders and replacing membranes with a leaching sheet or shield to prevent flow, installing anode holders, removing anode(s), leaching and rinsing of anolyte and catholyte reservoir and cells, removing anode holders and replacing leaching shield with membrane (s) and installing anode holder, pouring the anolyte and catholyte bath, bringing the bath to a stable process temperature, and finally qualifying the process to verify chemistry performance and mechanical function and cell performance.

All of these sequentially executed steps can take around 24 hours, which means a relatively long down time for a corresponding system. With embodiments herein, however, a given bath rinse and leach can be executed in one reservoir, while another reservoir provides a process electrolyte for continued plating operations. Moreover, if simply switching reservoirs was not possible (such as when all reservoirs need to be changed), having the reservoirs outside of a plating tool means that cleaning a chemical management system can be performed in just a few hours.

In addition to the electrochemical plating cell 125 as described herein, embodiments can include one or more methods used in plating a substrate. One concern with operating an electro-chemical deposition system is osmotic transfer during idle periods. When current is flowing between the anode and cathode/substrate, respective concentrations of additives and acids are maintained in the anolyte fluid and in the catholyte fluid. Without current flowing, however, the two different electrolytes will slowly equalize concentrations across the ion exchange membrane. This can be prevented by removing one of the fluids. Accordingly, the electrochemical plating cell can include a pump or mechanism to lower the catholyte fluid level below a bottom of the ion exchange membrane during idle periods.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An electrochemical deposition apparatus for depositing metal onto a substrate, the electrochemical deposition apparatus comprising:
a processing tank configured for holding an anolyte fluid, the processing tank sized sufficiently to receive one or more processing cells via a top opening of the processing tank;
an electrochemical plating cell sized and configured to be removably inserted into the processing tank, the electrochemical plating cell defining a catholyte fluid compartment configured for holding a catholyte fluid, the catholyte fluid compartment providing a fluid boundary between anolyte fluid in the processing tank and catholyte fluid in the electrochemical plating cell;
an ion exchange membrane removably coupled to the electrochemical plating cell, such that the ion exchange membrane is removably inserted into the processing tank along with the electrochemical plating cell, the ion exchange membrane providing a portion of the fluid boundary separating anolyte fluid in the processing tank from catholyte fluid in the electrochemical plating cell;
an anode removably positioned within the processing tank, the anode being positioned adjacent to the ion exchange membrane and being positioned at a sufficient distance from the ion exchange membrane to permit anolyte fluid flow between the anode and the ion exchange membrane;
a substrate holder configured to removably hold a substrate, the substrate holder configured to be removably inserted into the catholyte fluid compartment of the electrochemical plating cell such that the substrate is in contact with the catholyte fluid in the catholyte fluid compartment to deposit metal onto the substrate;
a catholyte fluid circulation system configured to pump catholyte fluid from a catholyte reservoir to the electrochemical plating cell such that catholyte fluid flows across a surface of the substrate, the catholyte reservoir being located at a location remote from the processing tank; and
an electrical system configured to generate a current between the anode and the substrate such that metal ions within the catholyte fluid are deposited on the substrate.

2. The apparatus of claim 1, wherein catholyte fluid circulation system includes a first catholyte conduit that supplies a first catholyte fluid to a first electrochemical plating cell, and a second catholyte conduit that supplies a second catholyte fluid to a second electrochemical plating cell, where the first catholyte fluid and the second catholyte fluid are different from each other, while both the first electrochemical plating cell and the second electrochemical plating cell are positioned in the processing tank having a single anolyte fluid.

3. The apparatus of claim 2, wherein the first catholyte fluid and the second catholyte fluid differ from each other in that each fluid has a different additive concentration.

4. The apparatus of claim 1, wherein the catholyte fluid circulation system is configured to selectively pump from one or more different catholyte reservoirs to one or more electrochemical plating cells residing in the processing tank.

5. The apparatus of claim 1, wherein the catholyte fluid circulation system is configured to remove catholyte fluid from the electrochemical plating cell during idle periods of electrochemical deposition.

6. The apparatus of claim 1, wherein the catholyte fluid circulation system includes a flow controller configured to stop flow of catholyte fluid into the catholyte fluid compartment prior to removing the substrate holder from the electrochemical plating cell.

7. The apparatus of claim 6, wherein the flow controller is configured to restart flow of catholyte fluid into the catholyte compartment after inserting the substrate holder into the electrochemical plating cell.

8. The apparatus of claim 1, wherein the electrochemical plating cell includes a catholyte fluid inlet positioned at an upper portion of the electrochemical plating cell, a catholyte fluid outlet positioned at the upper portion of the electrochemical plating cell, and wherein the electrochemical plating cell is configured to define a catholyte fluid flow path from the catholyte fluid inlet to a bottom portion of the electrochemical plating cell such that catholyte fluid flows within said electrochemical plating cell from said catholyte fluid inlet to the bottom portion of the electrochemical plating cell, then flows past the substrate in the electrochemical plating cell and toward the upper portion of the electrochemical plating cell, and then the catholyte fluid exits the catholyte fluid outlet.

9. The apparatus of claim 1, wherein the anode is removable from the processing tank independent from the electrochemical plating cell.

10. The apparatus of claim 1, wherein the anode is mechanically coupled to the electrochemical plating cell such that anode is removable from the processing tank with the electrochemical plating cell.

11. The apparatus of claim 1, wherein the anode includes a first anode on a first side of the electrochemical plating cell, and a second anode on a second side of the electrochemical plating cell, the second side being opposite to the first side.

12. The apparatus of claim 11, wherein the ion exchange membrane includes a first ion exchange membrane on a first side of the electrochemical plating cell, and a second ion exchange membrane on a second side of the electrochemical plating cell, the second side being opposite to the first side.

13. The apparatus of claim 12, wherein the substrate holder is configured to hold a substrate on each of opposite sides of the substrate holder.

14. The apparatus of claim 1, further comprising an anolyte circulation system configured to impart a flow of anolyte fluid within the processing tank.

15. The apparatus of claim 1, further comprising a membrane support mechanism configured to structurally support opposite sides of the ion exchange membrane while defining openings that permit ion flow through the ion exchange membrane.

16. The apparatus of claim 1, further comprising an agitation mechanism which is positioned in the electrochemical plating cell and which is configured to agitate catholyte fluid at the surface of the substrate.

17. The apparatus of claim 1, wherein the anode comprises an inert anode.

18. The apparatus of claim 1, wherein the electrochemical plating cell includes an inlet receiving catholyte fluid from the catholyte reservoir by way of the catholyte fluid circulation system, and further wherein the electrochemical plating cell includes an outlet through which catholyte fluid exits the electrochemical plating cell and returns to the catholyte reservoir by way of the catholyte fluid circulation system.

19. An apparatus according to claim 18, further including:
a guide provided on the electrochemical plating cell for guiding insertion and removal of the substrate holder into and out of the electrochemical plating cell; and wherein the electrical system is configured to provide an electrical connection with the substrate holder when the substrate holder is positioned in the electrochemical plating cell to provide a current between the anode and the substrate held by the substrate holder.

20. The apparatus according to claim 1, further including:

an actuated electrical contact providing electrical current to said anode and which is actuated between a contact position at which contact is established with the anode and a release position at which the actuated electrical contact does not contact the anode.

* * * * *